(12) United States Patent
Hubbard et al.

(10) Patent No.: US 8,900,885 B1
(45) Date of Patent: Dec. 2, 2014

(54) WAFER BONDING MISALIGNMENT REDUCTION

(71) Applicant: International Business Machines Corporation, Armonk, NY (US)

(72) Inventors: Alex R. Hubbard, East Greenbush, NY (US); Douglas C. La Tulipe, Jr., Guilderland, NY (US); Spyridon Skordas, Troy, NY (US); Kevin R. Winstel, East Greenbush, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/903,198

(22) Filed: May 28, 2013

(51) Int. Cl.
*H01L 21/00* (2006.01)
*H01L 21/66* (2006.01)
*H01L 21/30* (2006.01)
*H01L 23/00* (2006.01)

(52) U.S. Cl.
CPC .............. *H01L 22/12* (2013.01); *H01L 24/80* (2013.01)
USPC ...................... 438/5; 438/7; 438/14; 438/455

(58) Field of Classification Search
None
See application file for complete search history.

(56) References Cited

U.S. PATENT DOCUMENTS

| | | |
|---|---|---|
| 6,404,481 B1 | 6/2002 | Feldman et al. |
| 6,870,599 B2 | 3/2005 | Kurosawa |
| 6,967,708 B1 | 11/2005 | Yokoyama et al. |
| 7,440,078 B2 | 10/2008 | Bleeker et al. |
| 7,718,327 B2 | 5/2010 | Okita |
| 8,164,736 B2 | 4/2012 | Shibazaki |
| 2008/0050081 A1 | 2/2008 | Goebel et al. |
| 2008/0180646 A1 | 7/2008 | Colburn et al. |
| 2010/0139836 A1 | 6/2010 | Horikoshi |

FOREIGN PATENT DOCUMENTS

JP        07183210 A        7/1995

OTHER PUBLICATIONS

Greed Jr., J., et al. "Variable Magnification in A 1:1 Projection Lithography System" SPIE vol. 334 Optical Microlithography—Technology for the Mid-1980s. Sep. 1982. pp. 2-9.
Maltabes, J., et al. "Overlay Alignment Method" An IP.com Prior Art Database Technical Disclosure. Oct. 1989. (2 Pages).

*Primary Examiner* — Scott B Geyer
(74) *Attorney, Agent, or Firm* — Tutunjian & Bitetto, P.C.; Yuanmin Cai

(57) ABSTRACT

A method for wafer bonding includes measuring grid distortion for a mated pairing of wafers to be bonded to determine if misalignment exists between the wafers. During processing of subsequent wafers, magnification of one or more lithographic patterns is adjusted to account for the misalignment. The subsequent wafers are bonded with reduced misalignment.

20 Claims, 6 Drawing Sheets

WAFER BONDING MISALIGNMENT REDUCTION

BACKGROUND

1. Technical Field

The present invention relates to wafer bonding, and more particularly to methods for improving alignment between wafers to be bonded.

2. Description of the Related Art

Bonding layer grid mismatch between top and bottom wafers can be observed prior to wafer bonding. Mismatches between these layers increase limitations to scaling through silicon vias (TSVs) and associated TSV landing pad areas. Such differences can occur during lithographic processing or, more likely, due to bonding preparation, especially if the wafers are quite different (e.g., single versus stack, pattern loading, etc.).

SUMMARY

A method for wafer bonding includes measuring grid distortion for a mated pairing of wafers to be bonded to determine if a magnification mismatch exists between the wafers. During processing of subsequent wafers, magnification of one or more lithographic patterns is adjusted to account for the magnification mismatch. The subsequent wafers are bonded with reduced misalignment.

Another method for wafer bonding includes measuring grid distortion for a mated pairing of wafers to be bonded to determine if misalignment exists between the wafers; during processing of subsequent wafers, making grid distortion measurements continuously to provide feedback for making lithographic magnification offset adjustments to minimize misalignment; and bonding the subsequent wafers.

Yet another method for wafer bonding includes measuring grid distortion for a mated pairing of wafers to be bonded, the measuring being performed after lithographical processing of bonding layers formed on each of the mated pairing of wafers to determine if misalignment exists between the wafers; during processing of subsequent wafers, adjusting magnification of one or more lithographic patterns to account for the misalignment by shrinking or expanding lithographic exposure patterns for at least one layer on at least one wafer, the adjusting magnification includes one or more of: adjusting a landing pad layer for through vias; adjusting all layers by a misalignment amount; and adjusting a plurality of layers by an incremental amount to gradually achieve a misalignment amount; checking layout specifications to ensure compliance after adjusting magnification; and bonding the subsequent wafers.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
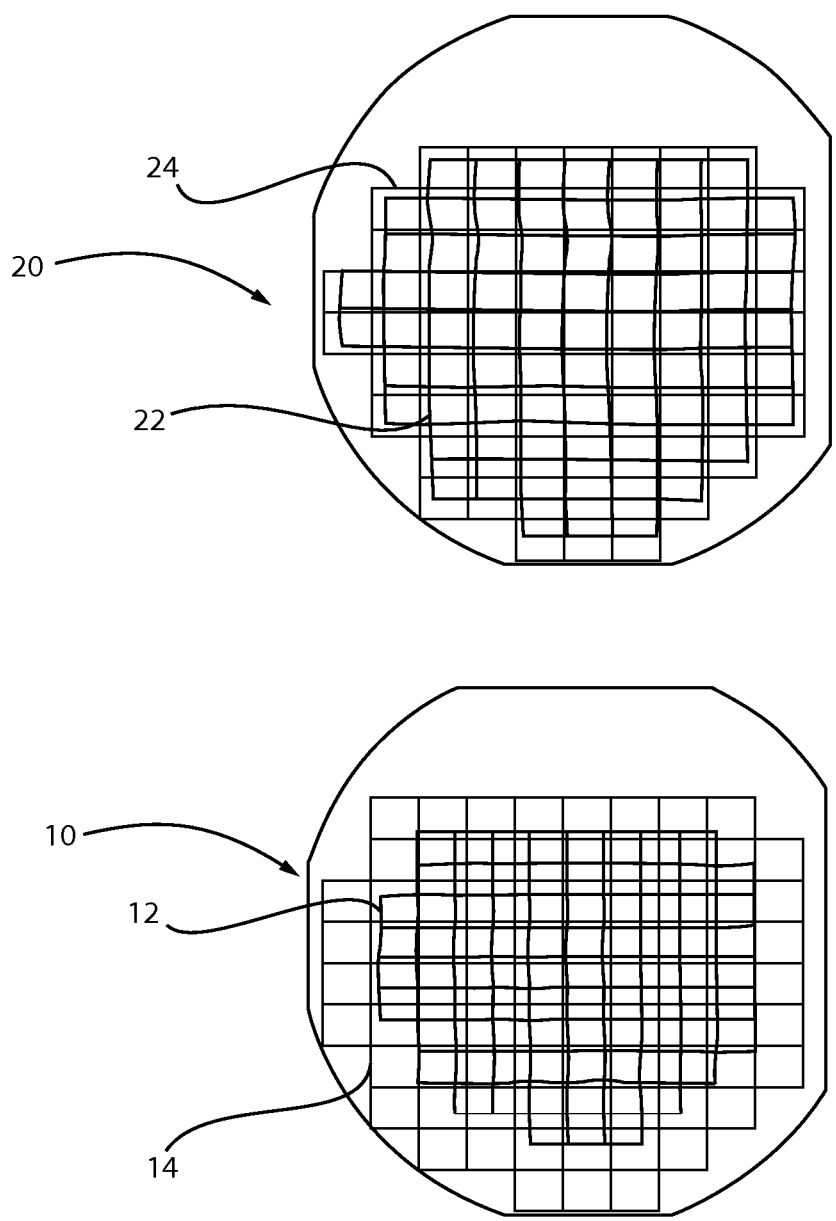
FIG. 1 illustratively depicts a top wafer and a bottom wafer having a real grid and an expected grid mapped thereon to provide an understanding of grid distortion in accordance with the present principles.

In accordance with the present principles, magnification corrections are employed as needed to different levels of wafers to be bonded to improve wafer alignment. Bonding layer preparation is executed, which may include preparing layers for bonding. At this point, grid distortion is measured before wafer bonding to establish if there is a magnification mismatch between top and bottom wafers. During processing or an integration setup, grid distortion is measured, e.g., by aligning mark positions against an expected grid.

Based on learning, shrinking or expansion is performed on lithographic exposure for one or both of the bonding layers as needed or as possible. In one embodiment, the grid distortion measurements may continuously be employed as feedback to control lithographic magnification to minimize misalignment. The present principles address the issues associated with lithographic magnification corrections as needed for the levels of the wafers to be bonded.

It is to be understood that the present invention will be described in terms of a given illustrative architecture having wafers to be bonded; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip made in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a bottom wafer 10 shows a real grid 12 and an expected grid 14 mapped thereon. Also a top wafer 20 shows a real grid 22 and an expected grid 24 mapped thereon for the formation of a bonding layer. The real grids 12, 22 and the expected grids 14, 20 for the bottom wafer 10 and top wafer 20, respectively tend to be misaligned or mismatched due to a variety of factors including but not limited to prior processing steps (lithography), bowing, alignment tolerances, etc. These are depicted in an exaggerated state in FIG. 1 to highlight that the planned or expected grid is often contracted or expanded from the real grid. The actual mismatch can be in the order of a few (e.g., 1-30 ppm) parts per million (ppm) of unit length.

Mismatches between the real grids will result in mismatches between the bonded wafers. In accordance with the present principles, the mismatches are accounted for by adjusting future processing steps to make up for the misalignments.

Figure 2:
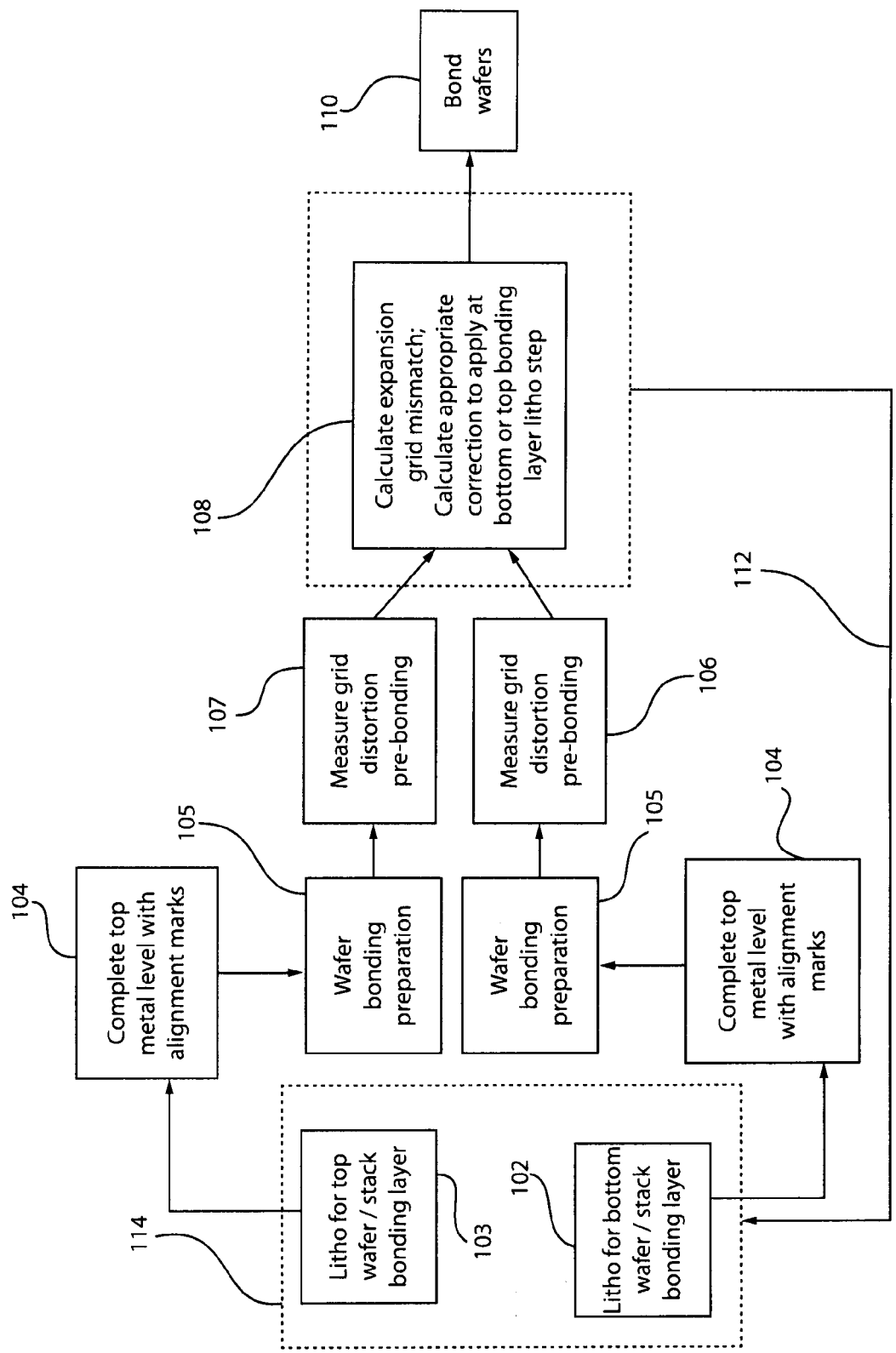
FIG. 2 is a block/flow diagram showing a method for reducing misalignment between wafers in accordance with the present principles.

Referring to FIG. 2, a block/flow diagram shows a method for aligning and bonding wafers in accordance with one illustrative embodiment. The method may be iterative depending on the implementation. In block 102, lithographic processing is performed on a bottom wafer or stack of wafers to form structures for chips on the wafer, including formation of any needed landing pads for through silicon vias (TSVs) that will be formed later. In block 103, lithographic processing is performed on a bottom wafer or stack of wafers to form structures for chips on the wafer, including formation of any needed landing pads for TSVs that will be formed later. In blocks 104, individual metal level building on each wafer is concluded. This includes forming alignment mark structures to be used during later wafer bonding. In blocks 105, wafer bonding preparation is performed. This wafer bonding preparation may include depositing films, thermal treatments, polishing, etching, cleaning or otherwise preparing opposing surfaces of the wafers for bonding. In other words, the wafers are finished and then taken to the last step before actual bonding occurs so that an accurate misalignment determination can be made.

In block 106, grid distortion is measured for the bottom wafer. In block 107, grid distortion is measured for the top wafer. The grid distortions are measured using known metrology tools to determine an expansion or contraction of each wafer (real grid) against the expected grid in the next step.

In block 108, an expansion/contraction grid mismatch is determined as between the top and bottom wafers. In addition, an appropriate correction amount is determined to apply to at least one of the top wafer or the bottom wafer. The correction may include an expansion/contraction amount that can be corrected by adjusting a single layer, adjusting all layers or gradually adjusting a number of layers to account for the mismatch.

A path 112 returns to block 114 where future processing on new wafers occurs to account for mismatches. For example, a determination of how much misalignment exists between the wafers is made. The mismatch may be in terms of an expansion or contraction magnification across the wafer. In one example, a mismatch of ~2.5 ppm difference in relative grid magnification between top and bottom wafer adds ~0.8 microns of relative expansion across a 300 mm wafer. Say the mismatch includes an expansion between a top wafer and a bottom wafer of 2.5 ppm. A next top wafer may be processed to account for the full mismatch, the top wafer and the bottom wafer may be processed to each make up a portion of the mismatch (to add up to the full mismatch) or the next bottom wafer may be processed to account for the full mismatch. For matched wafers where the mismatch has been accounted for in the fabrication process, the wafers are bonded in block 110.

Alternately, the present principles may provide a method for controlling the wafer bonding alignment performance in production by implementing bonding layer grid inspections prior to bonding and providing the results in the automatic data feedback path 112 to the bonding layer lithography and/or other lithographic levels as needed, where adjustments can be applied. In other words, the layers may include an incremental or full adjustment of the mismatch which is measured layer-by-layer to ensure that the mismatch is accounted for in the final product.

Figure 3A:
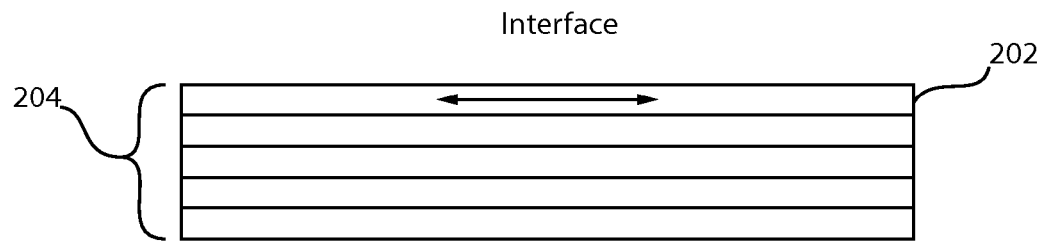
FIG. 3A is an illustrative diagram showing layers of a device wherein one layer has a magnification adjustment in accordance with the present principles.
Figure 3B:
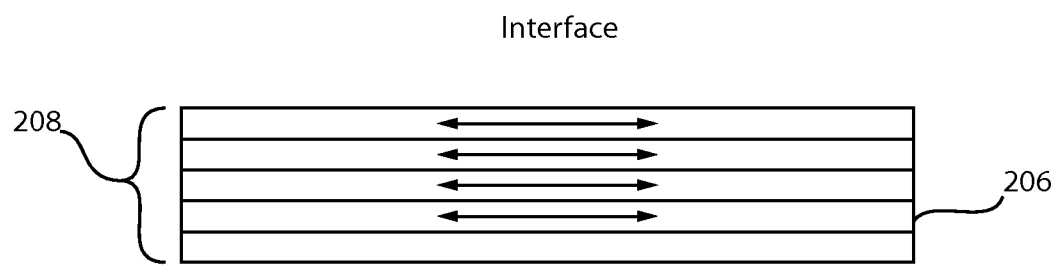
FIG. 3B is an illustrative diagram showing layers of a device wherein all or a subset of all layers include a magnification adjustment in accordance with the present principles.
Figure 3C:
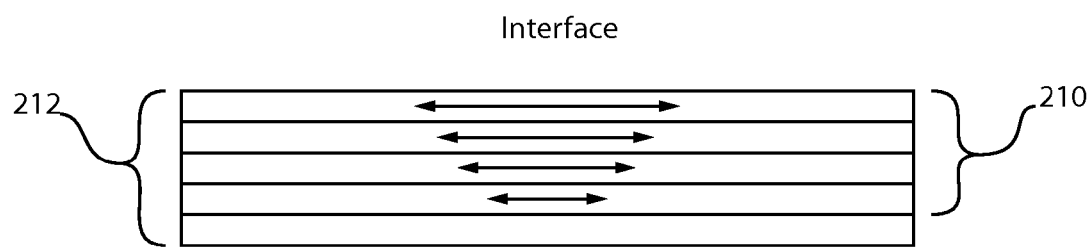
FIG. 3C is an illustrative diagram showing layers of a device wherein all or a subset of all layers include an incremental magnification adjustment to build up to a full adjustment in accordance with the present principles.

Referring to FIGS. 3A-3C, the methods for reducing misalignment for wafer bonding may be implemented by magnification adjustments during lithographic definition of the wafer bonding levels to offset any observed grid magnification differences between the bonded wafers prior to bonding. The magnification adjustments are illustratively depicted as double arrows within layers of FIGS. 3A-3C. It should be understood that the layers in FIGS. 3A-3C represent layers, levels or even wafers.

In FIG. 3A, a layer 202 adjacent to a bonding in interface (Interface) in a stack of layers 204 (e.g., for either the top wafer or the bottom wafer) is expanded or contracted the full amount of the magnification misalignment. The Interface is the location where a next layer or wafer is to be provided in alignment with the existing layers. Structure 204 may represent the whole wafer or a wafer stack with all its layers prior to bonding. In one embodiment, magnification modification is performed by increasing or decreasing a lithographic pattern to accommodate the magnification changes needed to ensure minimum misalignment during wafer bonding. For example, if a 2.5 ppm increase is needed, the lithographic pattern is adjusted across the wafer to enlarge the pattern. Of course, design rule checking and other quality control processing may be carried out to ensure no layout violations occur. As the adjustment of layer 202 needs to comply with design rules, magnification in a single step should not be excessive in terms of magnification adjustment such that appropriate connections and alignments are still appropriately made in the stack of layers within the design rules specifications. In one embodiment, the correction is made on the last layer of the wafer. In another embodiment, the adjustment is made in a lower layer and the adjustment is propagated out to the last layer to ensure proper alignment.

In FIG. 3B, a layer 206 in a stack of layers 208 (for either the top wafer or the bottom wafer) is expanded or contracted the full amount of the magnification misalignment and all subsequent layers (above layer 206 toward the Interface) are expanded or contracted by the same amount to ensure alignment between the layers 208. Structure 208 may represent the whole wafer or a wafer stack with all its layers prior to bonding. In other words, all subsequent layers are expanded or contracted by a same amount to ensure proper alignment between components and to account for wafer to wafer mismatch for wafer bonding. The adjustment of layer 206 needs to comply with design rules and should not be excessive in magnification adjustment such that appropriate connections and alignments are made between adjacent layers.

In FIG. 3C, a number of layers 210 in a stack of layers 212 (for either the top wafer or the bottom wafer) is expanded or contracted an incremental amount at each level until the full amount of the magnification misalignment is compensated for. Structure 212 may represent the whole wafer or a wafer stack with all its layers prior to bonding. The adjustments need to comply with design rules and should not be excessive in magnification adjustment such that appropriate connections and alignments are made between adjacent layers.

In other embodiments, the adjustment methods as described with respect to FIGS. 3A-3C may be combined so that adjustments can be made on both the top and bottom wafers. Different adjustment techniques may be employed in combination. For example, the method for FIG. 3A may be employed on the top wafer while the method of FIG. 3C is employed on the bottom wafer to achieve the overall magnification. Other combinations are contemplated. The layers may be measured at each layer and may include an incremental or full adjustment of the mismatch which is measured layer-by-layer to ensure that the mismatch is accounted for in the final product. Each structure shown in FIGS. 3A, 3B, 3C represents a whole wafer or wafer stack with some metal levels and/or lithographic layers that need to be adjusted so that the wafer grid distortion at the final bonding layer is the same or as close as possible to that of a different wafer that will be bonded to the wafer shown.

Figure 4:
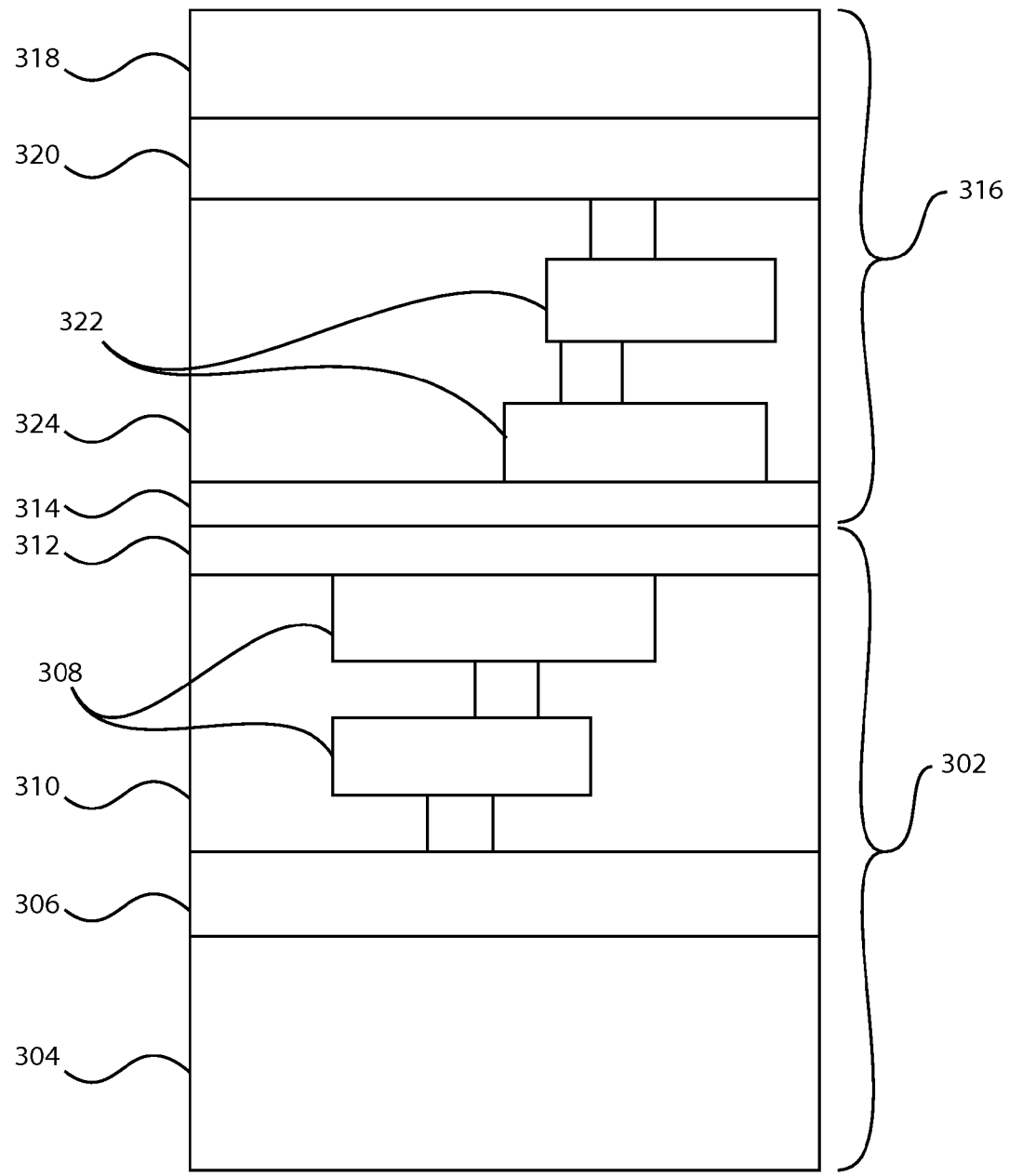
FIG. 4 is a cross-sectional view showing one example of wafers bonded in accordance with the present principles.

Referring to FIG. 4, a cross-sectional view of wafers (not-to-scale) after bonding is shown in accordance with one illustrative embodiment. A bottom wafer 302 includes a substrate layer 304, e.g., silicon. Front end of the line (FEOL) structures are formed in an FEOL layer 306. Back end of the line (BEOL) structures 308 are formed in a BEOL layer 310. It should be understood that other layers in addition to or instead of those described may also be employed. A bonding layer or agent 312 is formed on the wafer 302. The bonding layer 312 may be an oxide layer (e.g., for oxide-oxide bonding), but may represent alternative methods, such as an adhesive, metal studs/pillars, solder bumps or other material and structures capable of bonding the bonding layer 312 to a bonding layer 314 of a top wafer 316.

The top wafer 316 includes a substrate layer 318, e.g., silicon, that is ground down and/or wet etched to thin the substrate layer 318. Front end of the line (FEOL) structures are formed in an FEOL layer 320. Back end of the line (BEOL) structures 322 are formed in a BEOL layer 324. It should be understood that other layers in addition to or instead of those described may be employed. The bonding layer or agent 314 is formed on the wafer 316, similarly as described for bonding layer 312.

The bonding layers 312 and 314 are formed on their respective wafers using a multitude of processes typical in microelectronic circuit fabrication, including lithography patterning processes. During process/integration setup, grid distortion (alignment mark positions versus expected grid positions) is measured right before the actual wafer bonding. Grid distortion is measured before wafer bonding to establish if there is magnification mismatch between top and bottom wafers. Since these wafers are already fabricated, the distortion may not be correctable at this stage for wafer bonding without misalignment. However, the magnification mismatch can be accounted for in the fabrication process for future wafers.

Based on the measured mismatch, lithographic expansion or contraction may be implemented to shrink or expand one or more layers being patterned by lithographic exposure for one or both of the wafers as needed or as possible (see e.g. FIGS. 3A-3C) for subsequent wafers in preparation for bonding. Magnification adjustment, done at through silicon via (TSV) landing pad levels or for all lithographic levels on a target wafer, is employed to preserve in-wafer overlay prior to bonding.

Figure 5:
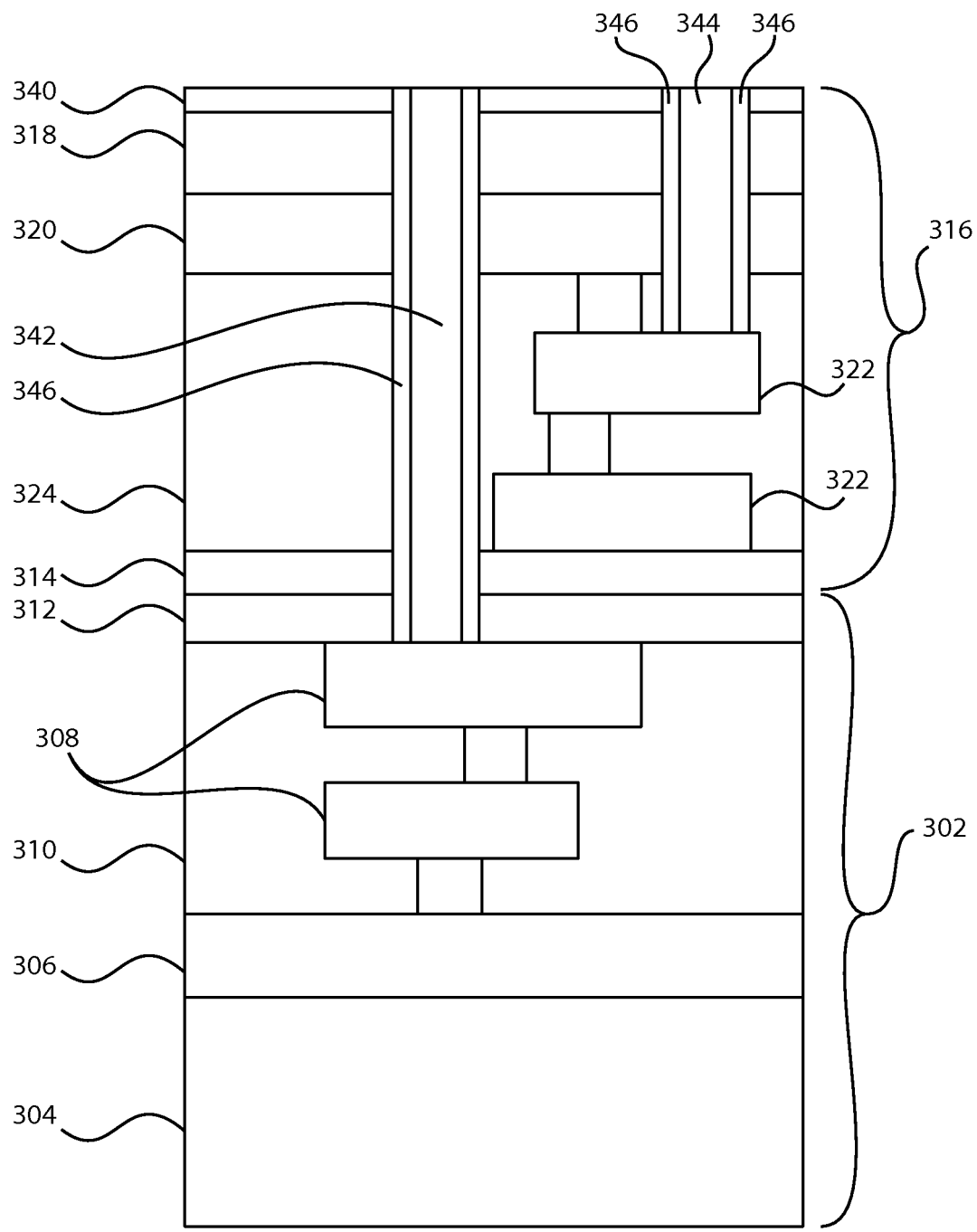
FIG. 5 is a cross-sectional view showing vias formed in the bonded wafers of FIG. 4 in accordance with the present principles.

Referring to FIG. 5, a cross-sectional view of bonded wafers having TSVs after bonding is shown in accordance with one illustrative embodiment. A hard mask 340 is formed on the substrate layer 318 of top wafer 316, patterned and employed to etch vias 342 and 344 through the substrate layer 318 and down to landing pads formed in the structures 308 and 322, respectively. The vias (TSVs) 342, 344 are preferably lined with a dielectric material 346 and filled with electrically conductive material to enable electrical connections.

Dimensions of landing pads for TSVs on the bottom wafer 302 need to be large enough to absorb any possible wafer bonding misalignment (e.g., up to +/−2 microns). This can be unacceptable as it results in reduction of available useful real estate on chips and also prohibits efficient scaling down of TSV critical dimensions (CD) and pitch.

In accordance with the present principles, the grid mismatches between the top and bottom wafer grids are accounted for during fabrication lithography prior to wafer bonding to significantly reduce wafer bonding misalignment and to reduce limitations to scaling TSVs and associated TSV landing pad areas as described.

It should be understood that the present embodiments are described in terms of a top wafer and a bottom wafer. However, the top wafer or the bottom wafer may include one or more bonded wafers. It should also be understood that the wafers may include different technologies or devices of different types. For example, one wafer may include logic devices while the other may include memory devices. Such differences are more likely to cause mismatches that need to be accounted for.

Figure 6:
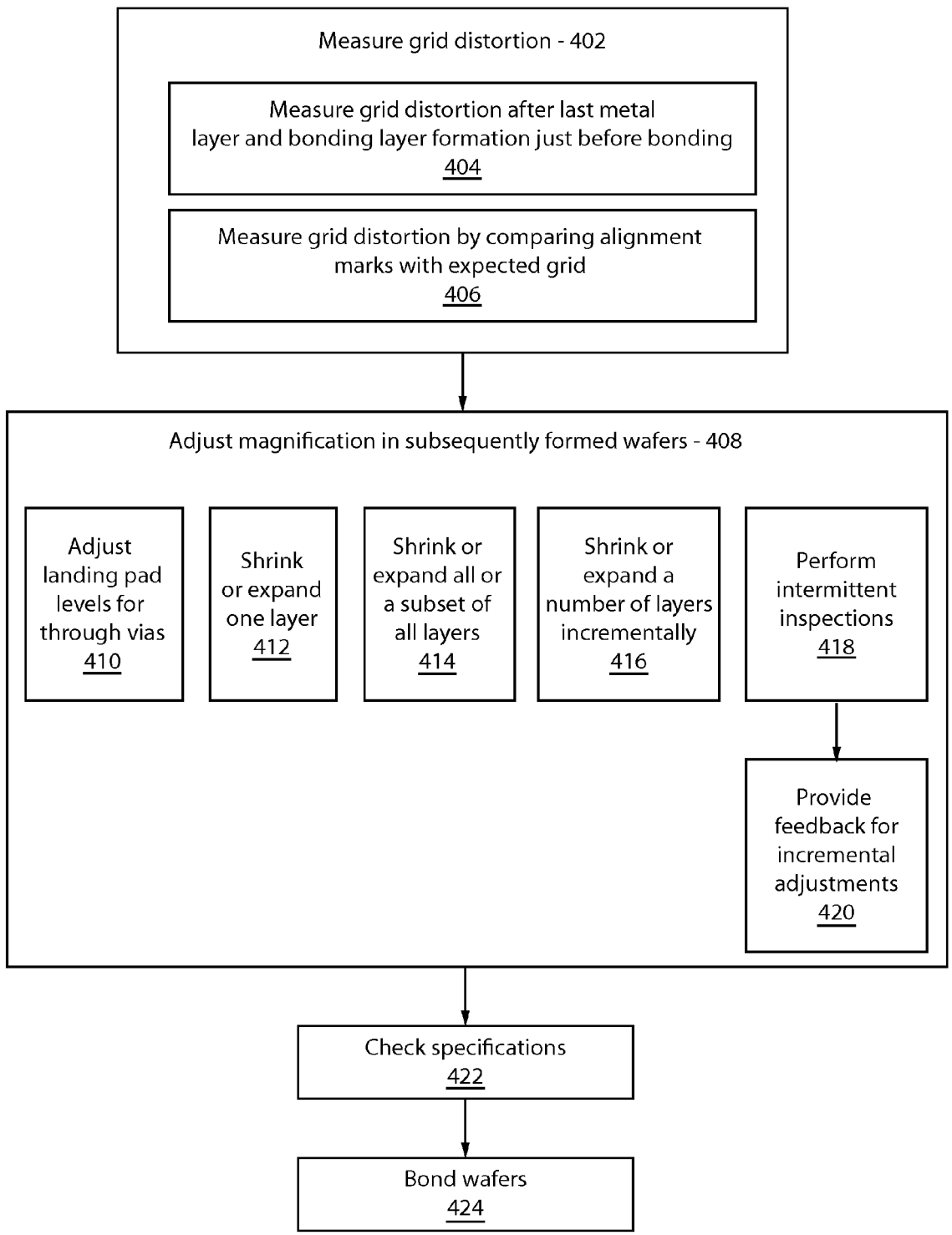
FIG. 6 is a block/flow diagram showing methods for bonding wafers in accordance with illustrative embodiments.

Referring to FIG. 6, a method for wafer bonding is illustratively shown in accordance with one embodiment. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 402, grid distortion is measured for a mated pairing of wafers to be bonded to determine if misalignment exists between the wafers prior to bonding. In block 404, measure grid distortion after a topmost metal layer in the wafer is finished, a bonding layer has been formed and just prior to bonding. In block 406, measuring grid distortion includes measuring alignment mark positions against an expected grid for each wafer.

In block 408, during processing of subsequent wafers, magnification of one or more lithographic patterns may be adjusted to account for the misalignment. In block 410, magnification adjustments may include adjusting levels or layers with landing pads for through vias (TSVs). In block 412, magnification adjustments may include shrinking or expanding lithographic exposure patterns for at least one layer on at least one wafer. In block 414, magnification adjustments may include adjusting all or a subset of all layers by a misalignment amount. In block 416, magnification adjustments may include adjusting a plurality of layers by an incremental amount to gradually achieve a misalignment amount. In block 418, magnification adjustments may include controlling wafer bonding alignment performance by implementing grid inspections (intermittently) prior to bonding; and providing data feedback to layer lithography so that adjustments are applied during lithographic processing to minimize misalignment in block 420.

In block 422, layout specifications are checked to ensure compliance after adjusting magnification. In block 424, the subsequent wafers are bonded. The present principles reduce bonding misalignment due to incoming bonding layer grid distortions without having to implement complex or costly integration changes. Lithographic magnification adjustment maintains the design. In one embodiment, a method is provided to automatically control/correct for bonding misalignment issues in production.

Methods for reducing misalignment during wafer bonding are provided by implementing magnification adjustments during lithographic definition of the wafer bonding levels to offset any observed grid magnification differences between the bonded wafers prior to bonding. The present methods may be employed for controlling wafer bonding alignment performance by implementing bonding layer(s) grid inspections prior to bonding and providing the results in automatic data feedback to the bonding layer lithography, where adjustments can be applied.

Having described preferred embodiments for wafer bonding misalignment reduction (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for wafer bonding, comprising:
   measuring grid distortion for a mated pairing of wafers to be bonded to determine if misalignment exists between the wafers;
   during processing of subsequent wafers, adjusting magnification of one or more lithographic patterns to account for the misalignment; and
   bonding the subsequent wafers.

2. The method as recited in claim 1, wherein measuring grid distortion includes measuring grid distortion after definition of bonding layers, which are formed on each of the mated pairing of wafers to be bonded, and just before bonding the mated pairing of wafers.

3. The method as recited in claim 1, wherein measuring grid distortion includes measuring alignment mark positions against an expected grid for each wafer.

4. The method as recited in claim 1, wherein adjusting magnification includes shrinking or expanding lithographic exposure patterns for at least one layer on at least one wafer.

5. The method as recited in claim 1, wherein adjusting magnification includes adjusting a landing pad layer for through vias.

6. The method as recited in claim 1, wherein adjusting magnification includes adjusting all layers by a misalignment amount.

7. The method as recited in claim 1, wherein adjusting magnification includes adjusting a plurality of layers by an incremental amount to gradually achieve a misalignment amount.

8. The method as recited in claim 1, wherein adjusting magnification includes controlling wafer bonding alignment performance by:
   implementing grid inspections prior to bonding; and
   providing data feedback to layer lithography so that adjustments are applied during lithographic processing to minimize misalignment.

9. The method as recited in claim 1, further comprising checking layout specifications to ensure compliance after adjusting magnification.

10. A method for wafer bonding, comprising:
    measuring grid distortion for a mated pairing of wafers to be bonded to determine if misalignment exists between the wafers;
    during processing of subsequent wafers, making grid distortion measurements continuously to provide feedback for making lithographic magnification offset adjustments to minimize misalignment; and
    bonding the subsequent wafers.

11. The method as recited in claim 10, wherein measuring grid distortion includes measuring grid distortion after definition of bonding layers, which are formed on each of the mated pairing of wafers to be bonded, and just before bonding the mated pairing of wafers.

12. The method as recited in claim 10, wherein measuring grid distortion includes measuring alignment mark positions against an expected grid for each wafer.

13. The method as recited in claim 10, wherein making the magnification offset adjustments includes adjusting magnification by shrinking or expanding lithographic exposure patterns for at least one layer on at least one wafer.

14. The method as recited in claim 13, wherein adjusting magnification includes adjusting a landing pad layer for through vias.

15. The method as recited in claim 13, wherein adjusting magnification includes adjusting all layers by a misalignment amount.

16. The method as recited in claim 13, wherein adjusting magnification includes adjusting a plurality of layers by an incremental amount to gradually achieve a misalignment amount.

17. The method as recited in claim 10, wherein making grid distortion measurements includes checking grid distortion intermittently during fabrication processing.

18. The method as recited in claim 10, further comprising checking layout specifications to ensure compliance after adjusting magnification offsets.

19. A method for wafer bonding, comprising:
measuring grid distortion for a mated pairing of wafers to be bonded, the measuring being performed after lithographical processing of bonding layers formed on each of the mated pairing of wafers to determine if misalignment exists between the wafers;
during processing of subsequent wafers, adjusting magnification of one or more lithographic patterns to account for the misalignment by shrinking or expanding lithographic exposure patterns for at least one layer on at least one wafer, the adjusting magnification includes one or more of: adjusting a landing pad layer for through vias; adjusting all layers by a misalignment amount; and adjusting a plurality of layers by an incremental amount to gradually achieve a misalignment amount;
checking layout specifications to ensure compliance after adjusting magnification; and
bonding the subsequent wafers.

20. The method as recited in claim 19, wherein measuring grid distortion includes measuring alignment mark positions against an expected grid for each wafer.

* * * * *